United States Patent
Lin et al.

(10) Patent No.: US 11,799,423 B2
(45) Date of Patent: Oct. 24, 2023

(54) METHOD OF BUILDING OSCILLATOR FREQUENCY ADJUSTMENT LOOKUP TABLE AND ASSOCIATED TRANSCEIVER

(71) Applicant: REALTEK SEMICONDUCTOR CORPORATION, Hsinchu (TW)

(72) Inventors: Hung Min Lin, Hsinchu (TW); Hung-Yuan Yang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 19 days.

(21) Appl. No.: 17/742,420

(22) Filed: May 12, 2022

(65) Prior Publication Data

US 2023/0131944 A1   Apr. 27, 2023

(30) Foreign Application Priority Data

Oct. 27, 2021 (TW) .................................. 110139906

(51) Int. Cl.
  *H03B 5/36* (2006.01)
  *G06F 1/08* (2006.01)
(52) U.S. Cl.
  CPC ................ *H03B 5/36* (2013.01); *G06F 1/08* (2013.01); *H03B 2200/004* (2013.01)
(58) Field of Classification Search
  CPC ...................................................... H03B 5/36

USPC .......................................................... 327/17
See application file for complete search history.

(56) References Cited

U.S. PATENT DOCUMENTS

2020/0142000 A1* 5/2020 Wang ................. G01R 31/2884
2023/0228886 A1* 7/2023 Yu ........................... G01S 19/22
                                                                342/357.28

* cited by examiner

Primary Examiner — Tomi Skibinski
(74) Attorney, Agent, or Firm — WPAT, P.C., INTELLECTUAL PROPERTY ATTORNEYS; Anthony King

(57) ABSTRACT

The application discloses a method, for building an oscillator frequency adjustment lookup table in a transceiver, wherein the transceiver generates a clock according to a crystal oscillator external to the transceiver for transceiving data. The transceiver includes adjustable capacitor arrays assembly connected to the crystal oscillator, wherein when an equivalent capacitance of the adjustable capacitor assembly is a reference value, the crystal oscillator has a reference frequency, and when the equivalent capacitance changes relative to the reference value, the crystal oscillator correspondingly has a frequency offset relative to the reference frequency. The method includes: performing an interpolation operation according to a first value, a second value, and a third value of the equivalent capacitance, and the corresponding frequency variations, so as to obtain the frequency variations corresponding to a first sub-value between the first value and the second values.

20 Claims, 4 Drawing Sheets

METHOD OF BUILDING OSCILLATOR FREQUENCY ADJUSTMENT LOOKUP TABLE AND ASSOCIATED TRANSCEIVER

CROSS-REFERENCE TO RELATED APPLICATIONS

This application claims priority to Taiwan Application Serial Number 110139906, filed on Oct. 27, 2021, which is incorporated by reference in its entirety.

TECHNICAL FIELD

The present application relates to an oscillator frequency control, particularly to a method for building an oscillator frequency adjustment lookup table and a related transceiver or a related large-scale integrated circuit.

BACKGROUND

In the mobile communication specification, the frequency error requirement is higher, e.g., only 0.1 ppm error tolerance. In other words, in order to meet such mobile communication specifications, the crystal oscillator circuit of the corresponding transceiver must be able to use the oscillator to precisely generate the frequency that meets such requirements. However, in order to meet the above specification, the cost of the system factory often increases significantly; therefore, how to obtain similar results at a lower cost has become one of the urgent issues to be solved in the related field.

SUMMARY OF THE INVENTION

The application provides a method for building an oscillator frequency adjustment lookup table in a transceiver or a large-scale integrated circuit, wherein the transceiver or the large-scale integrated circuit generates a clock according to a crystal oscillator external to the transceiver for transceiving, and the transceiver includes an adjustable capacitor set coupled to the crystal oscillator, wherein when an equivalent capacitance of the adjustable capacitor set is a reference value, the crystal oscillator has a reference frequency, and when the equivalent capacitance changes in relative to the reference value, the crystal oscillator correspondingly generates a frequency variation relative to the reference frequency, the method including: obtaining the frequency variations corresponding to a first value, a second value and a third value of the equivalent capacitance; performing interpolation according to the first value, the second value and the third value of the equivalent capacitance and the corresponding frequency variations to obtain the frequency variation corresponding to a first sub-value between the first value and the second value of the equivalent capacitance and obtain the frequency variation corresponding to a second sub-value between the second value and the third value of the equivalent capacitance; and storing the first value, the first sub-value, the second value, the second sub-value and the third value of the equivalent capacitance and the corresponding frequency variations in the oscillator frequency adjustment lookup table in a memory cell of the transceiver.

The application provides a transceiver, configured to generate a clock for transceiving according to a crystal oscillator external to the transceiver, the transceiver including: an adjustable capacitor set, coupled to the crystal oscillator, wherein when the equivalent capacitance of the adjustable capacitor set is a reference value, the has a reference frequency, and when the equivalent capacitance changes relative to the reference value, the crystal oscillator correspondingly generates a frequency variation relative to the reference frequency; perform interpolation according to the first value, the second value and the third value of the equivalent capacitance and the corresponding frequency variations to obtain the frequency variation corresponding to a first sub-value between the first value and the second value of the equivalent capacitance having and obtain the frequency variation corresponding to a second sub-value between the second value and the third value of the equivalent capacitance having oscillator frequency adjustment lookup table, the oscillator frequency adjustment lookup table includes the first value, the first sub-value, the second value, the second sub-value and the third value of the equivalent capacitance and the corresponding frequency variations.

The method for building an oscillator frequency adjustment lookup table and a related transceiver of the present application can reduce chip manufacturing cost

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
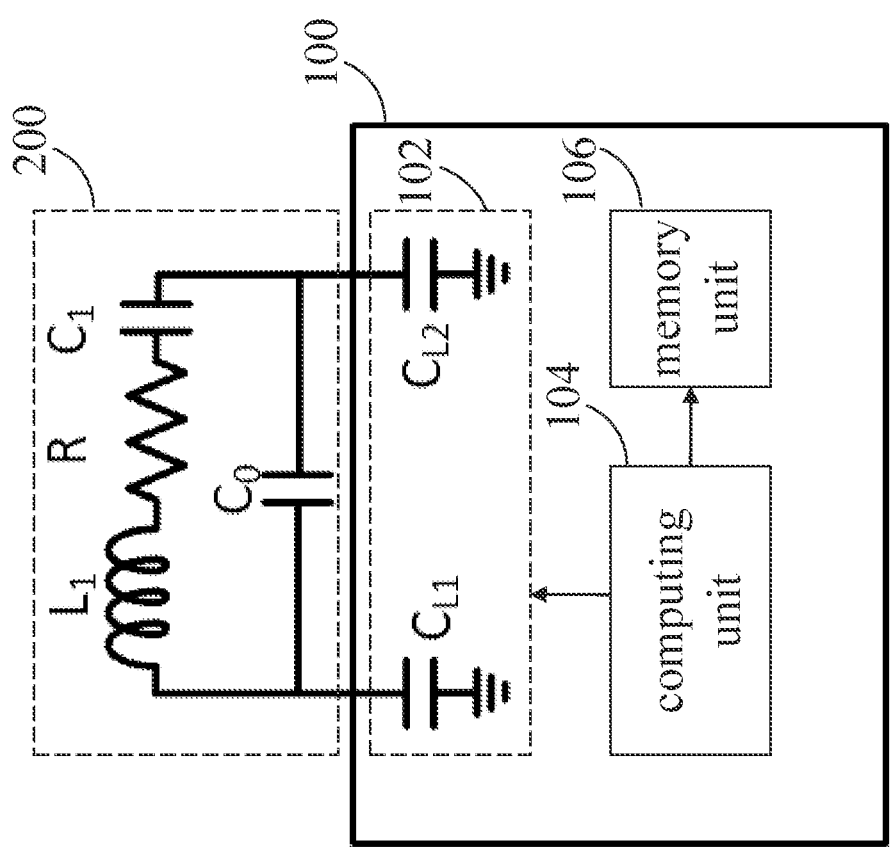
FIG. 1 is a schematic diagram illustrating embodiments of the present transceiver.

FIG. 1 is a schematic diagram illustrating embodiments of the present transceiver. The transceiver 100 generates a clock for transceiving according to a frequency generated by a crystal oscillator 200 external to the transceiver 100. The crystal oscillator 200 can be equivalently represented as a capacitor $C_0$, an inductor $L_1$, a resistor R. and a capacitor $C_1$. The inductor $L_1$, the resistor R and the capacitor $C_1$ are connected in series and connected in parallel with the capacitor $C_0$.

The transceiver 100 includes an adjustable capacitor set 102 coupled to the crystal oscillator 200, wherein the adjustable capacitor set 102 includes a first adjustable capacitor $C_{L1}$ and a second adjustable capacitor $C_{L2}$, one terminal of the first adjustable capacitor $C_{L1}$ is coupled to one terminal of the crystal oscillator 200, and another terminal of the first adjustable capacitor $C_{L1}$ is coupled to the ground; one terminal of the second adjustable capacitor $C_{L2}$ is coupled to another terminal of the crystal oscillator 200, and another terminal of the second adjustable capacitor $C_{L2}$ is coupled to the ground. Therefore, the first adjustable capacitor $C_{L1}$ and the second adjustable capacitor $C_{L2}$ are equivalently, connected in series with each other through the ground terminal, and the first adjustable capacitor $C_{L1}$ and the second adjustable capacitor $C_{L2}$ that are serially connected have an equivalent capacitance C. By adjusting the equivalent capacitance C, the resonant frequency of the crystal oscillator 200 can be changed.

Figure 2:
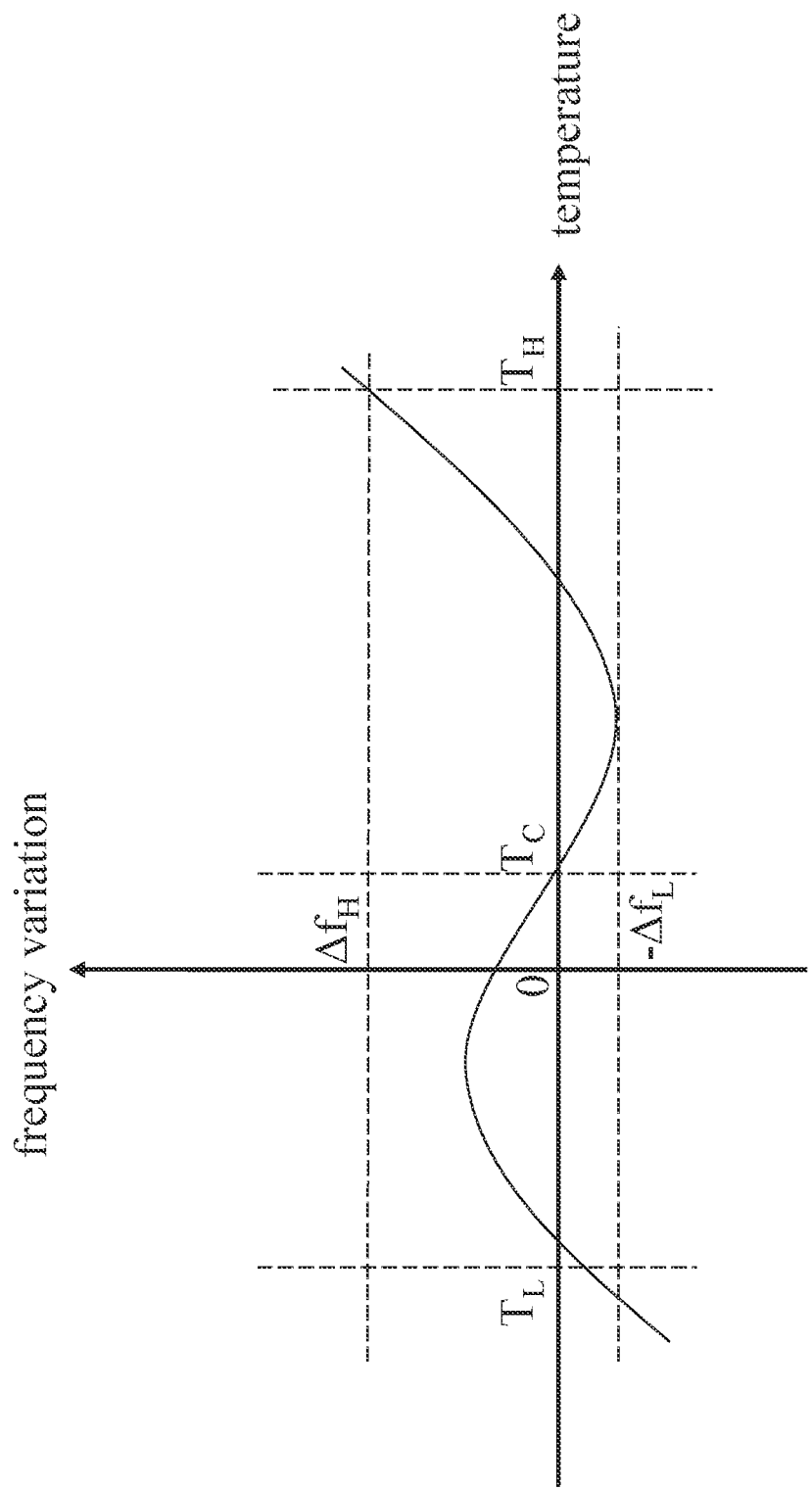
FIG. 2 is a curve diagram of crystal oscillator frequency variation versus temperature.

Generally, the equivalent capacitance value C is adjusted before shipping from the factory to reduce the error between the resonant frequency of the crystal oscillator 200 and the target frequency to within the range allowed by the specification. However, in actual use, it is possible that the temperature change may cause the above error to exceed the range allowed by the specification. As shown in FIG. 2, the factory temperature is $T_C$ and the error (frequency variation) between the resonant frequency and the target frequency of the crystal oscillator 200 is 0, if the transceiver 100 is required to operate normally between the temperature range $T_L$ and $T_H$ according to the specification, it means that the transceiver 100 should be able to cope with at least the most severe frequency variation between the temperature range $T_L$ and $T_H$, i.e., $\Delta f_H$ and $-\Delta f_L$.

Therefore, the transceiver 100 needs to monitor the resonant frequency of the crystal oscillator 200 dynamically and control the error of the crystal oscillator 200 at any time by adjusting the adjustable capacitance set 102. However, the equivalent capacitance value C and the resonant frequency of the crystal oscillator 200 are not linearly related, so the correspondence between the capacitance C and the resonant frequency of the crystal oscillator 200 must be recorded in an oscillator frequency adjustment lookup table (hereinafter referred to as the lookup table) in the memory cell 106 of the transceiver 100 in order to know how to adjust the adjustable capacitor set 102 to generate the desired frequency change to compensate the above error.

Figure 3:
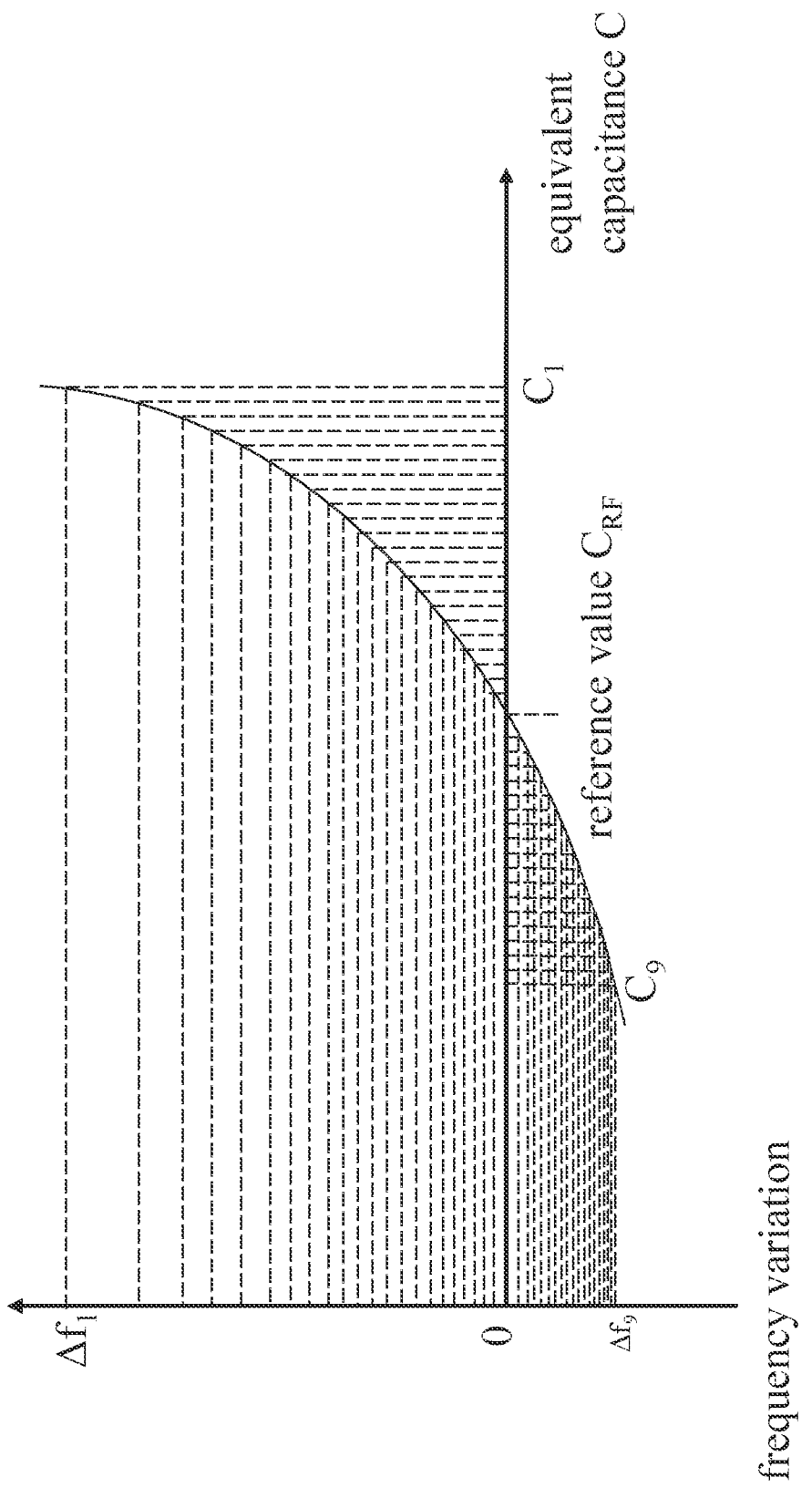
FIG. 3 is a curve diagram of the equivalent capacitance of the adjustable capacitor set against the frequency variation.

Referring to FIG. 3, a lookup table creation must be created before shipping. Broadly speaking, the purpose of this process is to find a frequency of the crystal oscillator 200 corresponding to multiple equivalent capacitances C within a range and record them in a lookup table, e.g., the multiple equivalent capacitances C may be spaced at fixed capacitance. In one embodiment, the equivalent capacitance C that causes the resonant frequency of the crystal oscillator 200 to be the target frequency at the time the process is performed can be taken as the reference value $C_{RF}$, and the multiple equivalent capacitances C different from the reference value $C_{RF}$ and the differences between their corresponding frequencies of the crystal oscillator 200 and the target frequency (i.e., the frequency variation) can be obtained by measurement, and the multiple frequency variations corresponding to the multiple equivalent capacitances C are recorded in the lookup table. The setting of the range of equivalent capacitance C depends on the maximum positive and negative frequency variation to be allowed. For example, in FIG. 3, a frequency variation $\Delta f_9$ corresponding to the minimum equivalent capacitance C (i.e., the equivalent capacitance $C_9$) must be smaller than $-\Delta f_L$; a frequency variation $\Delta f_1$ corresponding to the maximum equivalent capacitance C (i.e., equivalent capacitance $C_1$) must be greater than $\Delta f_H$.

However, FIG. 3 is only provided for illustration, and in order to achieve the purpose of accurate adjustment of the crystal oscillator 200, the actual number of data points required to be measured is much more intensive than that indicated in FIG. 3, so as to meet the standard accuracy requirements. Therefore, the process of building the lookup table is very time-consuming and costly. Therefore, the process needs to be simplified, and the details are described below.

Returning to FIG. 1, the relationship between the equivalent capacitance C and the oscillation frequency f of the crystal oscillator 200 can be expressed as $$f = \frac{1}{2\pi} \frac{1}{\sqrt{L_1 C_1}} \sqrt{1 + \frac{C_1}{(C_0 + C)}}.$$

Figure 4:
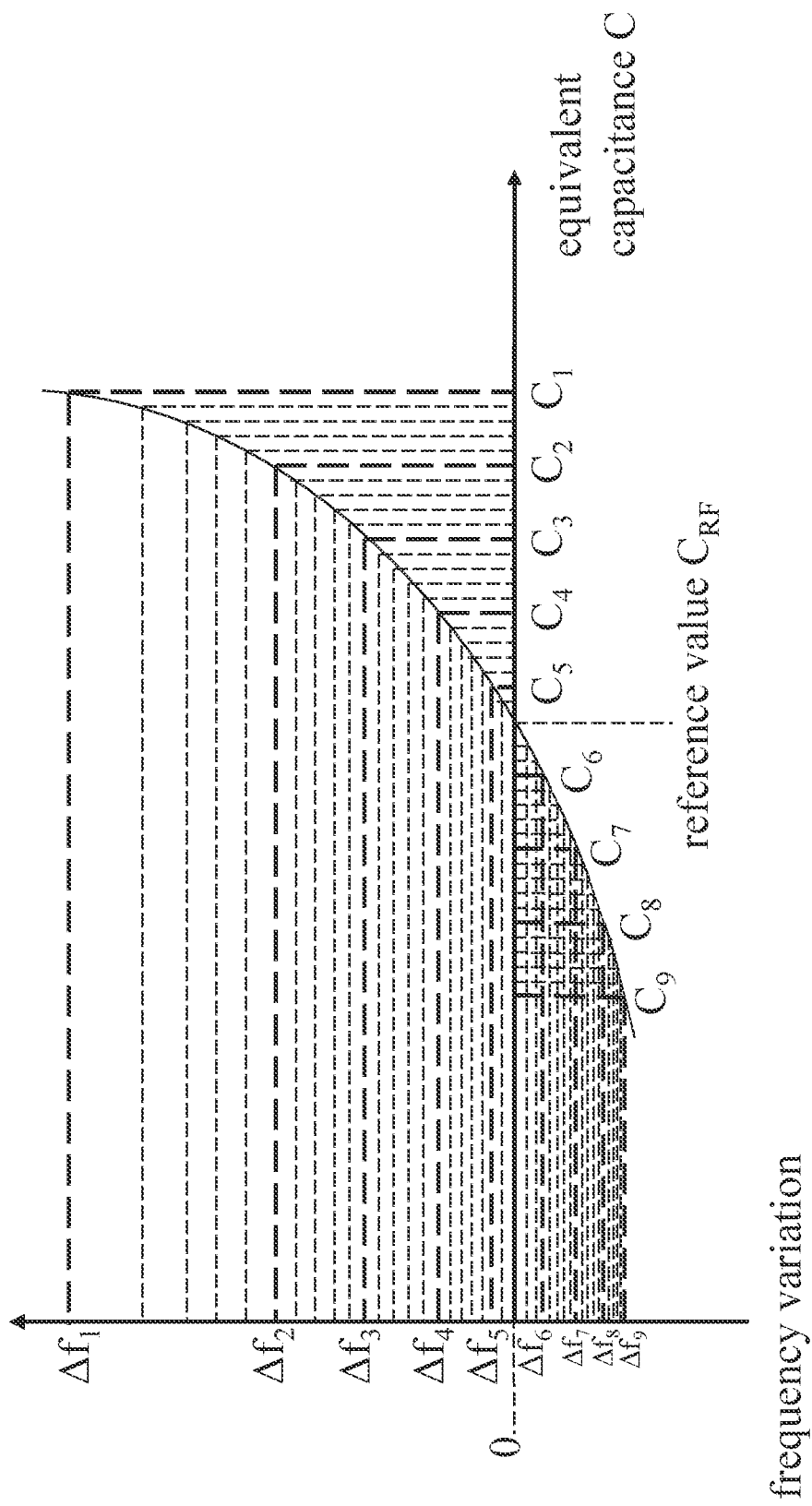
FIG. 4 is a schematic diagram illustrating of decomposing the curves shown in FIG. 3 into multiple curves.

To simplify the calculation, the present application proposes to use Taylor expansion to simplify the above relationship into a univariate n-degree polynomial related to the equivalent capacitance C, wherein n is a positive integer, i.e., the oscillation frequency $f(C) = \alpha_0 + \alpha_1(C-C_\alpha) + \alpha_2(C-C_\alpha)^2 + \ldots + \alpha_n(C-C_\alpha)^n$, where $C_\alpha$ is the expansion point of the polynomial, $\alpha_0$ is the coefficient of the constant term, $\alpha_1$ is the coefficient of the first term, and so on so forth for $\alpha_2$ to $\alpha_n$. Theoretically, the larger the n, the better the curve approximating the curve shown in FIG. 3 can be obtained, but the complexity is related to the size of n. In order to strike a balance between accuracy and cost, the present embodiment divides the curve of FIG. 3 into several subsections as shown in FIG. 4, and uses different quadratic polynomials as the model for each subsection.

In the present embodiment, the transceiver 100 shown in FIG. 1 further includes a computing unit 104, and when building the lookup table, the computing unit 104 can use different quadratic polynomials as the model for each subsection, and then use interpolation to obtain the frequency variations corresponding to multiple points in each subsection (multiple equivalent capacitances C). For example, the computing unit 104 can adjust the equivalent capacitance value of the adjustable capacitor group 102 to a first value $C_1$ and then perform measurement to obtain the frequency variation $\Delta f_1$, then it can adjust the equivalent capacitance value of the adjustable capacitor group 102 to a second value $C_2$ and then perform measurement to obtain the frequency variation $\Delta f_2$; then it can adjust the equivalent capacitance value of the adjustable capacitor group 102 to a third value $C_3$ and then perform measurement to obtain the frequency variation $\Delta f_3$. As can be seen from FIG. 4, compared with measuring each point, four points are skipped between the first value $C_1$ and the second value $C_2$ in FIG. 4, and four points are also skipped between the second value $C_2$ and the third value $C_3$. However, the present embodiment is only illustrative, and the actual number of points to be skipped can be much higher.

Next, the computing unit 104 obtains a first univariate quadratic polynomial as the model representing the curve between the first value $C_1$ and the third value $C_3$ according to the first value $C_1$, the second value $C_2$ and the third value $C_3$ and the corresponding frequency variation $\Delta f_1$, frequency variation $\Delta f_2$ and frequency variation $\Delta f_3$. In other words, the first univariate quadratic polynomial is used to approximate the relationship between the crystal oscillator 200 and the equivalent capacitance C within the range between the first value C and the third value C. In this embodiment, the second value $C_2$ is the average of the first value $C_1$ and the third value $C_3$ in order to reduce the complexity of the computation and to obtain better results; however, the present disclosure is not limited thereto; in some embodiments, the distances between the first value $C_1$, the second value $C_2$ and the third value $C_3$ may also be unequal.

Therefore, the frequency variation corresponding to any value of the equivalent capacitance C between the first value $C_1$ and the third value $C_3$ can be obtained immediately by using the first univariate quadratic polynomial without further measurement and the frequency variation can be recorded in the lookup table of the memory unit 106. Thus, most of the measurement time in the process of building the lookup table can be saved.

Similarly, the computing unit 104 can adjust the equivalent capacitance value of the adjustable capacitor group 102 to a fourth value $C_4$ and then perform measurement to obtain the frequency variation $\Delta f_4$; then it can adjust the equivalent capacitance value of the adjustable capacitor group 102 to a fifth value $C_5$ and then perform measurement to obtain the frequency variation $\Delta f_5$. Then, the computing unit 104 obtains a second univariate quadratic polynomial as the model representing the curve between the third value $C_3$ and the fifth value $C_5$ according to the third value $C_3$, the fourth value $C_4$ and the fifth value $C_5$ and the corresponding frequency variation $\Delta f_3$ (that has been measured previously), frequency variation $\Delta f_4$ and frequency variation $\Delta f_5$. In other words, the second univariate quadratic polynomial is used to approximate the relationship between the crystal oscillator 200 and the equivalent capacitance C within the range between the third value $C_3$ and the fifth value $C_5$. Thus, the frequency variation corresponding to any value of the equivalent capacitance C between the third value $C_3$ and the fifth value $C_5$ can be obtained immediately by using the second univariate quadratic polynomial without further measurement and the frequency variation can be recorded in the lookup table of the memory unit 106. Thus, most of the measurement time in the process of building the lookup table can be saved.

In this way, computing unit 104 can obtain a third univariate quadratic polynomial as a model for the curve between the fifth value $C_5$ and the seventh value $C_7$; and obtain a fourth univariate quadratic polynomial as a model for the curve between the seventh value $C_7$ and the ninth value $C_9$ to cover the desired range of frequency variation.

The foregoing embodiments are not intended to limit the scope of the present application. In some embodiments, more than four univariate quadratic polynomials can be used to form the curve between the frequency variation $\Delta f_1$ to the frequency variation $\Delta f_9$ in FIG. 4. Theoretically, dividing the same range of curves into more and more different segments to be modeled by different univariate quadratic polynomials can improve the accuracy, but in practice, as long as the accuracy is within the specification, there is room to reduce the time (i.e., cost) required to create the lookup table.

What is claimed is:

1. A method for building an oscillator frequency adjustment lookup table in a transceiver or a large-scale integrated circuit, wherein the transceiver or the large-scale integrated circuit generates a clock according to a crystal oscillator external to the transceiver for transceiving, and the transceiver comprises an adjustable capacitor set coupled to the crystal oscillator, wherein when an equivalent capacitance of the adjustable capacitor set is a reference value, the crystal oscillator has a reference frequency, and when the equivalent capacitance changes in relative to the reference value, the crystal oscillator correspondingly generates a frequency variation relative to the reference frequency, the method comprising:
  obtaining the frequency variations corresponding to a first value, a second value and a third value of the equivalent capacitance;
  performing interpolation according to the first value, the second value and the third value of the equivalent capacitance and the corresponding frequency variations to obtain the frequency variation corresponding to a first sub-value between the first value and the second value of the equivalent capacitance and obtain the frequency variation corresponding to a second sub-value between the second value and the third value of the equivalent capacitance; and
  storing the first value, the first sub-value, the second value, the second sub-value and the third value of the equivalent capacitance and the corresponding frequency variations in the oscillator frequency adjustment lookup table in a memory cell of the transceiver.

2. The method of claim 1, wherein the step of performing interpolation according to the first value, the second value and the third value of the equivalent capacitance and the corresponding frequency variations comprises:
  obtaining a first univariate quadratic polynomial of the equivalent capacitance according to the first value, the second value and the third value of the equivalent capacitance and the corresponding frequency variations.

3. The method of claim 2, wherein the first univariate quadratic polynomial is used to approximate a relationship between the crystal oscillator and the equivalent capacitance within the range between the first value and the third value.

4. The method of claim 2, further comprising:
  performing interpolation according to the third value, a fourth value and a fifth value of the equivalent capacitance and the corresponding frequency variations to obtain the frequency variation corresponding to a third sub-value between the third value and the fourth value of the equivalent capacitance and obtain the frequency variation corresponding to a fourth sub-value between the fourth value and the fifth value of the equivalent capacitance; and
  storing the third value, the third sub-value, the fourth value, the fourth sub-value and the fifth value of the equivalent capacitance and the corresponding frequency variations in the oscillator frequency adjustment lookup table in a memory cell of the transceiver.

5. The method of claim 4, wherein the step of performing interpolation according to the third value, the fourth value and the fifth value of the equivalent capacitance and the corresponding frequency variations comprises:
  obtaining a second univariate quadratic polynomial of the equivalent capacitance according to the third value, the fourth value and the fifth value and the corresponding frequency variations.

6. The method of claim 5, wherein the second univariate quadratic polynomial and the first univariate quadratic polynomial are different.

7. The method of claim 5, wherein the second univariate quadratic polynomial is used to approximate a relationship between the crystal oscillator and the equivalent capacitance within the range between the third value and the fifth value.

8. The method of claim 4, wherein the fourth value of the equivalent capacitance is an average value of the third value and the fifth value.

9. The method of claim 1, wherein the second value of the equivalent capacitance is an average value of the first value and the third value.

10. The method of claim 1, wherein the adjustable capacitor set includes a first adjustable capacitor and a second adjustable capacitor equivalently connected in series with each other.

11. A transceiver, configured to generate a clock for transceiving according to a crystal oscillator external to the transceiver, the transceiver comprising:
  an adjustable capacitor set, coupled to the crystal oscillator, wherein when the equivalent capacitance of the adjustable capacitor set is a reference value, the has a reference frequency, and when the equivalent capacitance changes relative to the reference value, the crystal oscillator correspondingly generates a frequency variation relative to the reference frequency;

perform interpolation according to the first value, the second value and the third value of the equivalent capacitance and the corresponding frequency variations to obtain the frequency variation corresponding to a first sub-value between the first value and the second value of the equivalent capacitance having and obtain the frequency variation corresponding to a second sub-value between the second value and the third value of the equivalent capacitance having oscillator frequency adjustment lookup table, the oscillator frequency adjustment lookup table includes the first value, the first sub-value, the second value, the second sub-value and the third value of the equivalent capacitance and the corresponding frequency variations.

12. The transceiver of claim 11, wherein the computing unit obtains a first univariate quadratic polynomial of the equivalent capacitance according to the first value, the second value and the third value of the equivalent capacitance and the corresponding frequency variations.

13. The transceiver of claim 12, wherein the first univariate quadratic polynomial is used to approximate a relationship between the crystal oscillator and the equivalent capacitance within the range between the first value and the third value.

14. The transceiver of claim 12, wherein the computing unit is further configured to perform interpolation according to the third value, a fourth value and a fifth value of the equivalent capacitance and the corresponding frequency variations to obtain the frequency variation corresponding to a third sub-value between the third value and the fourth value of the equivalent capacitance and obtain the frequency variation corresponding to a fourth sub-value between the fourth value and the fifth value of the equivalent capacitance; and the third value, the third sub-value, the fourth value, the fourth sub-value and the fifth value of the equivalent and the corresponding frequency variations.

15. The transceiver of claim 14, wherein the computing unit further obtain a second univariate quadratic polynomial of the equivalent capacitance according to the third value, the fourth value and the fifth value and the corresponding frequency variations.

16. The transceiver of claim 15, wherein the second univariate quadratic polynomial and the first univariate quadratic polynomial are different.

17. The transceiver of claim 15, wherein the second univariate quadratic polynomial is used to approximate a relationship between the crystal oscillator and the equivalent capacitance within the range between the third value and the fifth value.

18. The transceiver of claim 14, wherein the fourth value of the equivalent capacitance is an average value of the third value and the fifth value.

19. The transceiver of claim 11, wherein the second value of the equivalent capacitance is an average value of the first value and the third value.

20. The transceiver of claim 11, wherein the adjustable capacitor se includes a first adjustable capacitor and a second adjustable capacitor equivalently connected in series with each other.

* * * * *